United States Patent

Sakakibara et al.

[11] Patent Number: 5,621,689
[45] Date of Patent: Apr. 15, 1997

[54] NONVOLATILE SEMICONDUCTOR MEMORY DEVICE HAVING CONTROLLED CHARGE PUMP LOAD

[75] Inventors: Kiyohiko Sakakibara; Natsuo Ajika, both of Hyogo, Japan

[73] Assignee: Mitsubishi Denki Kabushiki Kaisha, Tokyo, Japan

[21] Appl. No.: 457,708

[22] Filed: Jun. 1, 1995

[30] Foreign Application Priority Data

Aug. 26, 1994 [JP] Japan .................................... 6-201880

[51] Int. Cl.$^6$ ........................................................... G11C 7/00
[52] U.S. Cl. ............................... 365/189.09; 365/189.11; 365/185.26; 365/185.29
[58] Field of Search ............................ 365/189.09, 189.11, 365/218, 185.15, 185.26, 185.29

[56] References Cited

U.S. PATENT DOCUMENTS

| | | | |
|---|---|---|---|
| 5,243,559 | 9/1993 | Murai | 365/185.29 |
| 5,343,423 | 8/1994 | Shimoji | 365/185.26 |
| 5,379,253 | 1/1995 | Bergemont | 365/185.26 |
| 5,406,524 | 4/1995 | Kawamura et al. | 365/185.26 |

FOREIGN PATENT DOCUMENTS 5-12889  1/1993  Japan .

OTHER PUBLICATIONS

"A Novel Cell Structure Suitable for a 3 Volt Operation, Sector Erase Flash Memory", H. Onoda et al., Technical Report of IEICE, SDM-93-24, ICD93-26, pp. 15-20.

"A Semiconductor MOS Memory and a Usage Thereof", Yasoji Suzuki, pp. 90-93, Nikkan Kogyo Shinbunsha.

Primary Examiner—David C. Nelms
Assistant Examiner—Son T. Pinh
Attorney, Agent, or Firm—Lowe, Price, LeBlanc & Becker

[57] ABSTRACT

It is postulated that a nonvolatile semiconductor memory device of the present invention includes a charge pump. The nonvolatile semiconductor memory device includes a memory cell array unit having a plurality of memory transistors formed therein to store data. Each memory transistor has a drain region connected to a predetermined bit line BL which is connected to a write circuit. A charge pump is connected to the write circuit. A predetermined potential is applied to a memory transistor via the write circuit by this charge pump in a writing mode. A charge pump load control means for suppressing variation in the charge pump load is connected to a memory transistor or a well region in which the memory transistor is formed. Thus, the charge pump load can be stabilized to allow improvement of the writing or erasing characteristics of the nonvolatile semiconductor memory device.

14 Claims, 15 Drawing Sheets

NONVOLATILE SEMICONDUCTOR MEMORY DEVICE HAVING CONTROLLED CHARGE PUMP LOAD

BACKGROUND OF THE INVENTION

1. Field of the Invention

The present invention relates to nonvolatile semiconductor memory devices having charge pumps, and more particularly to a nonvolatile semiconductor memory device including means to suppress variation in the load of the charge pump.

2. Description of the Prior Art

A flash memory is conventionally known as an example of a nonvolatile semiconductor memory device. A DINOR (DIvided bit-Line NOR) type flash memory which is one of such flash memories is disclosed in *TECHNICAL REPORT OF IEICE,* SDM93–24, ICD93–26, pp. 15–20.

In such a DINOR type flash memory, an erased state is where electrons are stored in a floating gate (charge storage electrode). A write (program) state is where electrons are drawn from the floating gate. In other words, an operation opposite to that of the generally known NOR type flash memory is carried out. The time required for an erase operation in an NOR type flash memory is approximately 100 msec.–1 sec., whereas the time required for a write operation in a DINOR type flash memory is as short as approximately 100 μsec.

FIG. 12 is a block diagram showing a structure of such a DINOR type flash memory. The structure and operation of a DINOR type flash memory will be described hereinafter.

Referring to FIG. 12, a memory cell array unit 15 is divided into sectors SE1 and SE2. Memory cell array unit 15 includes select gates SG1 and SG2 corresponding to sectors SE1 and SE2, respectively. Memory cell array unit 15 is formed in a p well region 16.

Two main bit lines MB0 and MB1 are arranged in memory cell array unit 15. Main bit lines MB0 and MB1 are connected to a sense amplifier 3 and a write circuit 4 via Y gate transistors YG0 and YG1 within each Y gate 17.

Two sub bit lines SB01 and SB02 are provided corresponding to main bit line MB0. Two sub bit lines SB11 and SB12 are provided corresponding to main bit line MB1. Word lines WL0 and WL1 are arranged so as to cross sub bit lines SB01 and SB11. Word lines WL2 and WL3 are arranged so as to cross sub bit lines SB02 and SB12.

Memory cells (memory transistors) M00–M03 and M10–M13 are provided at the crossings between sub bit lines SB01, SB02, SB11, and SB12 and word lines WL0–WL3. Memory cells M00, M01, M10, and M11 are included in sector SE1. Memory cells M02, M03, M12, and M13 are included in sectors SE2.

Each memory cell has its gate connected to a corresponding sub bit line, its control gate connected to a corresponding word line, and its source connected to a source line SL.

Select gate SG1 includes select gate transistors SG01 and SG11. Select gate SG2 includes select gate transistors SG02 and SG12. Sub bit lines SB01 and SB02 are connected to main bit line MB0 via select gate transistors SG01 and SG02, respectively. Sub bit lines SB11 and SB12 are connected to main bit line MB1 via select gate transistors SG11 and SG12, respectively.

An address buffer 9 receives an externally applied address signal to provide an X address signal to an X decoder 10 and an Y address signal to a Y decoder 8. X decoder 10 responds to an X address signal to select any of the plurality of word lines WL0–WL3. Y decoder 8 responds to a Y address signal to generate a select signal that selects any of the plurality of main bit lines MB0 and MB1.

The Y gate transistors in Y gate 17 respond to respective select signals to connect main bit lines MB0 and MB1 to sense amplifier 3 and write circuit 4. In a readout mode, sense amplifier 3 detects data read out on main bit line MB0 or main bit line MB1 to output the same via data input buffer 2. In a write mode, an externally applied data is provided to write circuit 4 via data input/output buffer 2. Write circuit 4 responds to the data to provide a program voltage to main bit lines MB0 and MB1.

High voltage generation circuits 5 and 6 receive externally applied power supply voltage Vcc (for example 5 V) to generate a high voltage. A negative voltage generation circuit 7 receives externally applied power supply voltage Vcc to generate a negative voltage. A verify voltage generation circuit 11 receives externally applied power supply voltage Vcc to provide a predetermined verify voltage to a selected word line in a verify mode. A well potential generation circuit 12 applies a negative voltage to p well region 16 in an erase mode. A source control circuit 13 provides a negative voltage to source line SL in an erase mode. Select gate decoder 14 responds to a portion of the address signal from address buffer 9 to selectively activate select gates SG1 and SG2.

A write/erase control circuit 1 responds to an externally applied control signal to control the operation of each circuit.

The operation of the DINOR type flash memory of the above-structure will be described hereinafter with reference to Table 1.

TABLE 1

| <1> Applied Voltage in Erase Mode | | | | | | | |
|---|---|---|---|---|---|---|---|
| Selected Sector Applied Voltage | | | | De-selected Sector Applied Voltage | | | |
| Vd | Vcg | Vs | Vbb | Vd | Vcg | Vs | Vbb |
| OPEN | 10 V | −8 V | −8 V | OPEN | 0 V | −8 V | −8 V |
| Selected Bit Applied Voltage | | | | De-selected Bit Applied Voltage | | | |
| Vd | Vcg | Vs | Vbb | Vd | Vcg | Vs | Vbb |
| <2> Applied Voltage in Writing Mode | | | | | | | |
| 5 V | −8 V | OPEN | 0 V | OPEN | 0 V | 0 V | 0 V |
| <3> Applied Voltage in Readout Mode | | | | | | | |
| 1 V | 3 V | 0 V | 0 V | OPEN | 0 V | 0 V | 0 V |

(1) Sector Erase Operation

It is assumed that sector SE1 is erased at one time. First, a control signal indicating a sector one-time-erasing operation is provided to write/erase control circuit 1. In response, high voltage generation circuit 6 and negative voltage generation circuit 7 are activated.

High voltage generation circuit 6 provides a high voltage (10 V) to X decoder 10. X decoder 10 applies a high voltage (Vcg=10 V) to word lines WL0 and WL1 of sector SE1, and 0 V to word lines WL2 and WL3 of sector SE2. Negative voltage generation circuit 7 provides a negative voltage to Y decoder 8 and well potential generation circuit 12. Y decoder 8 applies a negative voltage to Y gate transistors YG0 and YG1 in Y gate 17. This causes main bit lines MB0 and MB1 to attain a floating state. Source control circuit 13 applies a negative voltage (Vs=−8 V) to source line SL. Well potential generation circuit 12 applies a negative voltage (Vbb=−8 V) to p well region 16. Select gate decoder 14 turns off select gates SG1 and SG2.

Thus, the voltage shown in <1> of Table 1 is applied into the memory cells of selected sector SE1 and de-selected sector SE2. This causes all the memory cells in sector SE1 to attain an erase state.

(2) Write Operation

Here, it is assumed that memory cell M00 is to be programmed. More specifically, data "0" is written into memory cell M00, and memory cell M10 maintains data "1".

First, a control signal indicating a programming operation is provided to write/erase control circuit 1. In response, high voltage generation circuit 5 and negative voltage generation circuit 7 are activated.

Negative voltage generation circuit 7 applies a negative voltage to X decoder 10. X decoder 10 responds to an x address signal from address buffer 9 to select word line WL0 to which a negative voltage (−8 V) is applied. 0 V is applied to the de-selected word lines WL1–WL3.

High voltage generation circuit 5 applies a high voltage to Y decoder 8, write circuit 4, and select gate decoder 14. First, data "0" is provided to be latched in write circuit 4 via data input/output buffer 2. Y decoder 8 responds to a Y address signal from address buffer 9 to apply a high voltage to Y gate transistor YG0 and 0 V to Y gate transistor YG1 in Y gate 17. This causes Y gate transistor YG0 to be turned on.

Write circuit 4 applies a program voltage (Vd=5 V) corresponding to data "0" to main bit line MB0 via Y gate transistor YG0. Select gate decoder 14 turns on select gate SG1 and turns off select gate SG2. As a result, sub bit lines SB01 and SB11 are connected to main bit lines MB0 and MB1, respectively. Source control circuit 13 causes source line SL to attain a floating state. Well potential generation circuit 12 applies 0 V to p well region 16.

Thus, the voltage shown in the left column in <2> of Table 1 is applied to memory cell M00. This causes the threshold voltage of memory cell M00 to be reduced.

At the elapse of a predetermined time (for example 1 m second), data "1" is provided to be latched in write circuit 4 via data input/output buffer 2. Y decoder 8 responds to a Y address signal from address buffer 9 to apply a high voltage to Y gate transistor YG1 and 0 V to Y gate transistor YG0 in Y gate 17. As a result, Y gate transistor YG1 is turned on. Write circuit 4 applies 0 V corresponding to data "1" to main bit line MB1 via Y gate transistor YG1.

Thus, the voltage shown at the right column of <2> of Table 1 is applied to memory cell M10. As a result, the threshold voltage of memory cell M10 is maintained at its high level.

(3) Readout Operation

Here, it is assumed that data is read out from memory cell M00. First, a control signal specifying a readout operation is applied to write/erase control circuit 1.

X decoder 10 responds to an X address signal from address buffer 9 to select word line WL0 to which 3 V is applied. Here, word lines WL1–WL3 are maintained at 0 V. Select gate decoder 13 turns on select gate SG1 and turns off select gate SG2. Y decoder 8 responds to an Y address signal from address buffer 9 to turn on Y gate transistor YG0 in Y gate 17. Source control circuit 13 connects source line SL to ground.

Thus, the voltage shown at the left column of <3> in Table 1 is applied to the selected memory cell M00. As a result, a readout current flows to main bit line MB0 when the contents of memory cell M00 is "1". This read out current is detected by sense amplifier 3 to be output via data input/output buffer 2. Here, the voltage as shown in the right column of <3> of Table 1 is applied to a de-selected memory cell.

Reduction in the manufacturing cost is desired in the above-described DINOR type flash memory as in other devices. One approach is to carry out in common the channel doping step of a memory transistor of the DINOR type flash memory and the channel doping step of an n channel MOS transistor within the peripheral circuitry.

By carrying out the channel doping steps in common, the threshold voltage Vth of a memory transistor having a gate length of approximately 0.5 μm is reduced to the level of approximately 0.2 V–0.9 V. This reduction in the threshold voltage Vth of a memory transistor allows improvement of the writing characteristics. More specifically, the writing rate can be improved.

The reason why the writing characteristics can be improved by reducing the threshold voltage Vth of a memory transistor will be described hereinafter. When the capacitive coupling between the control gate/floating gate in a memory transistor is $\alpha_{CG}$, and the capacitive coupling of the floating gate/drain in a memory transistor is $\alpha_D$, the floating gate potential (Vfg) at the beginning of a writing operation is represented by the following $$Vfg = -\alpha_{CG} \cdot \Delta Vth + \Delta_D \cdot Vd + \alpha_{CG} \cdot Vcg \quad (1)$$

In the above equation (1), Vd is the drain voltage, Vcg shows the control gate voltage, $\Delta Vth = Vth^{Erase} - Vth^{init}$, where $Vth^{Erase}$ shows the threshold voltage Vth (5–6 V) of a memory transistor at the time of erasure, and $Vth^{init}$ shows the threshold voltage Vth in a memory transistor where there is no charge in the floating gate.

Referring to equation (1), ΔVth becomes larger by reducing the threshold voltage Vth of a memory transistor in an initial state. As a result, the electric field $(F=(Vd-Vfg)/t_{ox})$ between the floating gate/drain that determines the writing characteristics becomes greater. Therefore, the FN (Fowler-Nordheim) current is increased. This allows increase in the writing speed. Thus, the writing characteristics can be improved.

Thus, by carrying out in common the channel doping steps of a memory transistor and an n channel MOS transistor in peripheral circuitry, the manufacturing cost and also the writing characteristics of a DINOR type flash memory can be improved.

However, reducing the threshold voltage Vth in a memory transistor generates the following problems which will be described with reference to FIGS. 13 and 14. FIG. 13 is an equivalent circuit diagram showing a memory cell array unit, and FIG. 14 is a block diagram for describing a writing operation into a memory transistor.

Referring to FIG. 13, a control gate of a memory transistor (cell) is connected to predetermined word lines WL1–WL3.

The memory transistor has its drain region connected to predetermined bit lines BL1 and BL2, and its source region connected to source line SL.

Referring to FIG. 14, when writing is to be carried out with respect to a memory transistor connected to a certain word line WLn in a DINOR type flash memory, the information of the memory transistor in which data is to be written out of the memory transistors connected to that word line is provided to be latched in write circuit 4. A predetermined bit line bias (Vd=5–6 V) is applied to bit line BL including that memory transistor by a charge pump (referred simply as "CP" hereinafter) 19. Then, a negative bias (–8 V) is applied only to word line WLn. As a result, writing is carried out to desired memory transistors out of the memory transistors connected to word line WLn. Here, 0 V is applied to other word lines. For example, when writing is to be carried out into cell (2, 3) in FIG. 13, 5–6 V is applied to bit line BL2, and –8 V is applied to word line WL3.

The drain regions of the memory transistors connected to the bit line to which the above-described written memory transistor is connected receive the above-described Vd (5–6 V). In FIG. 13, Vd (5–6 V) is applied to the drain regions of cell (2, 1) and cell (2, 2). In FIG. 14, there are 63 bits of such de-selected memory transistors.

Because electrons are stored in the floating gate during a writing state in the DINOR type flash memory, the threshold voltage Vth of a memory transistor in an erase state is set higher than that of a write state. When ΔVth=3.0 V, $\alpha_{CG}$=0.6 and $\alpha_D$=0.1 in an erase state, the floating gate potential of the de-selected memory transistors to which 6 V is applied to the bit line at a writing operation differs depending upon whether the memory transistor is already written or not. This will be described more specifically hereinafter.

Floating gate potential of an already-written memory transistor

ΔVth=0, Vd=6 V, Vcg=0 are inserted into the above equation 1. As a result, Vfg=0.6 V is obtained.

Floating gate potential of a memory transistor not written ΔVth=3, Vd=6 V, Vcg=0 are inserted into equation 1. As a result, a floating gate potential of Vfg=–1.2 V is obtained.

The reduction of floating gate potential Vfg to the level of approximately 0.6 V in a memory transistor in which writing is already carried out causes a channel to be formed in that memory transistor. The reason thereof will be described hereinafter.

FIG. 15 shows the sub threshold characteristics of a memory transistor in a DINOR type flash memory. By defining the threshold voltage Vth of the memory transistor at the level where the current that flows between the source/drain region is Ids=1 µA under a drain voltage Vd=1 V, Vth=0.39 V is obtained.

In a memory transistor that is already written, the source region attains a floating state, so that the source potential Vs is assumed to be approximately 0 V. Since the floating gate potential Vfg of an already-written memory transistor is approximately 0.6 V as described above, a channel where a current up to approximately 10 µA is formed in the already-written memory transistor. This formation of a channel causes electrons to be drawn from the source region to the drain region of the memory transistor set at a floating state. Therefore, the source potential rises. As described above, a predetermined voltage generated by a CP is applied to the memory transistor at the time of writing. Here, a channel is formed in an already-written de-selected cell on the selected bit line. Therefore, the capacitance of this source region is added to the load of the CP. This results in increase in the load thereof. Thus, the rising speed of the CP is reduced, which in turn causes reduction in the writing rate.

When the source potential rises to a certain level, the rise thereof is stopped by a back gate effect. This back gate effect is a phenomenon in which the channel is cut off due to the relative increase in the potential difference between the channel surface potential and the source potential caused by increased in the potential of the source region with respect to the p well region. However, this source potential does not remain fixed, and is reduced by the tunnel effect that is generated in a memory transistor (cell (1, 3) in FIG. 3) having electrons stored in the floating gate and –8 V applied to the word line. FIG. 16 shows generation of leakage current due to tunnelling at the source terminal of an erase-state cell on the de-selected bit line. In the above cell (1, 3), the floating gate potential Vfg is approximately –6.5 V. This is obtained by substituting ΔVth=3 V, Vs=1 V, Vcg=–8 V into equation 1. The tunnel effect current is evaluated at the source region with $V_1$fg as –7 V. Therefore, a tunnel effect current of 1 nA/cell flows. There are many such memory transistors. Therefore, the potential of the source region is reduced. Then, the channel of the memory transistor is turned on again, which causes a rise in the source potential. This operation is repeated. As a result, the load of the CP is increased periodically. It is difficult to ensure stable writing characteristics.

FIG. 17 shows variation in the writing speed according to increase in the source potential of a memory transistor in a DINOR type flash memory. Under the state where the source attains an open state in FIG. 17, the threshold voltage Vth of the memory transistor is ~2.7 V (a state where the charge in the floating gate is approximately 0) at 100 µsec. In contrast, when the source potential rises to approximately 1 V, the writing time required to achieve the same Vth is as slow as ~200 µsec. Thus, there is a problem of reduction in the writing state in addition to unstabilization of the writing characteristics due to increase in the CP load.

As described above, when the threshold voltage Vth of a memory transistor is simply set to a low value in a conventional DINOR type flash memory, the load of the CP will not become stable. It is difficult to ensure stable writing characteristics.

SUMMARY OF THE INVENTION

In view of the foregoing, an object of the present invention is to ensure stable writing characteristics by stabilizing the CP load in a nonvolatile semiconductor memory device using a CP.

A nonvolatile semiconductor memory device according to the present invention includes a semiconductor substrate having a main surface, a well region, a memory transistor, a charge pump, and a charge pump load control unit. The well region is formed in the main surface of the semiconductor substrate. The memory transistor is formed on a well region to store data. The charge pump is connected to a memory transistor to generate a predetermined voltage which is applied to a memory transistor in carrying out data writing/erasure. The charge pump load control unit is connected to a memory transistor or a well region to control change in the load of the charge pump.

As described above, a nonvolatile semiconductor memory device according to the present invention comprises a charge pump load control unit. Thereby, it is possible to suppress the change of the load of CP.

Thus, reduction in the rising speed of the charge pump can be prevented effectively. As a result, stable writing characteristics can be ensured in a nonvolatile semiconductor memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
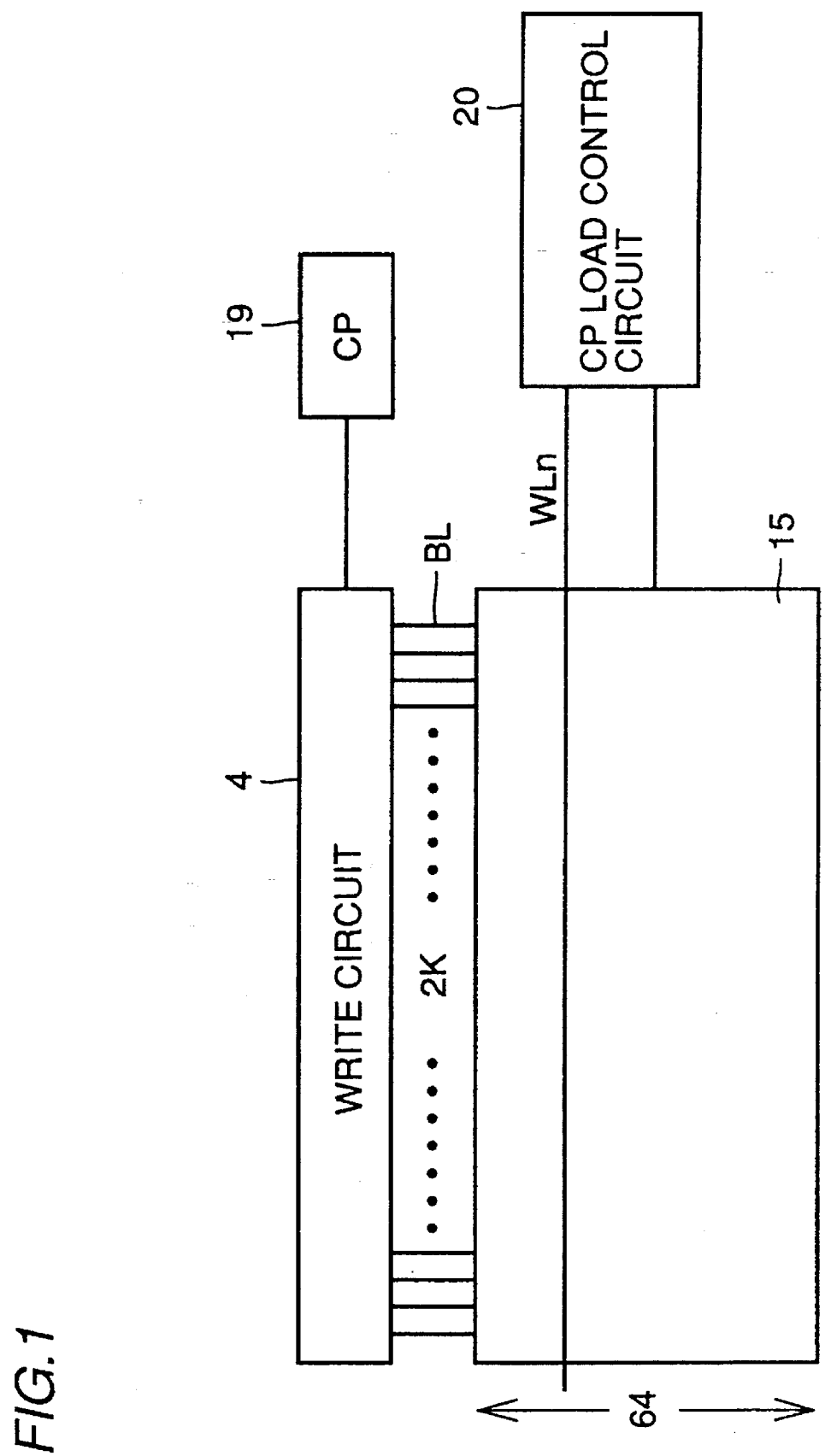
FIG. 1 is a block diagram schematically showing the concept of the present invention.

A first embodiment of the present invention will be described hereinafter with reference to FIGS. 1–3.

First, the main concept of the present invention will be described with reference to FIG. 1. Referring to FIG. 1, a DINOR type flash memory according to the present invention has a CP (Charge Pump) load control means 20 connected to a memory cell array unit 15. CP load control means 20 is connected to a memory transistor formed in memory cell array unit 15 or to a well region in memory cell array unit 15 in which this memory transistor is formed. The provision of this CP load control means 20 allows suppression in change of the load of CP 19 in a writing mode. It is therefore possible to improve the writing characteristics.

Specific structures of CP load control means 20 will be described according to the present embodiment to the third embodiment.

The concept of the present embodiment will be described with reference to FIG. 3. Referring to FIG. 3, a memory transistor 23 is formed on a p well region 16. Memory transistor 23 includes n type source/drain regions 21 and 22, a floating gate 25, and a control gate (word line) 27. Source/drain regions 21 and 22 are provided spaced apart so as to define a channel region at the surface of p well region 16. Drain region 22 preferably has an n-diffusion layer 22a. The provision of n-diffusion layer 22a allows increase of the breakdown voltage at the vicinity of drain region 22. A gate insulation layer 24 is formed on the channel region. A floating gate 25 is formed on gate insulation layer 24. Electrons are stored in floating gate 25. A control gate 27 is formed on floating gate 25 with an interlayer insulation layer 26 therebetween.

In the present embodiment, source positive voltage applying means 28 is connected to source region 21 in memory transistor 23 of the above-described structure. Source positive voltage applying means 28 serves to apply a positive voltage to source region 21 in a writing mode (when electrons are drawn from floating gate 25). The provision of this source positive voltage applying means 28 allows the application of a desired positive voltage to source region 21 in a writing operation.

More specifically, when a voltage of approximately −8 V is applied to control gate 27 and a voltage of approximately 6 V is applied to drain region 22, a predetermined positive voltage is applied to source region 21 by source positive voltage applying means 28. Therefore, formation of a channel by a back gate effect in an already-written memory transistor connected to a selected bit line can be prevented. It is therefore possible to effectively prevent rise in the potential of source region 21 during a writing operation.

Figure 10:
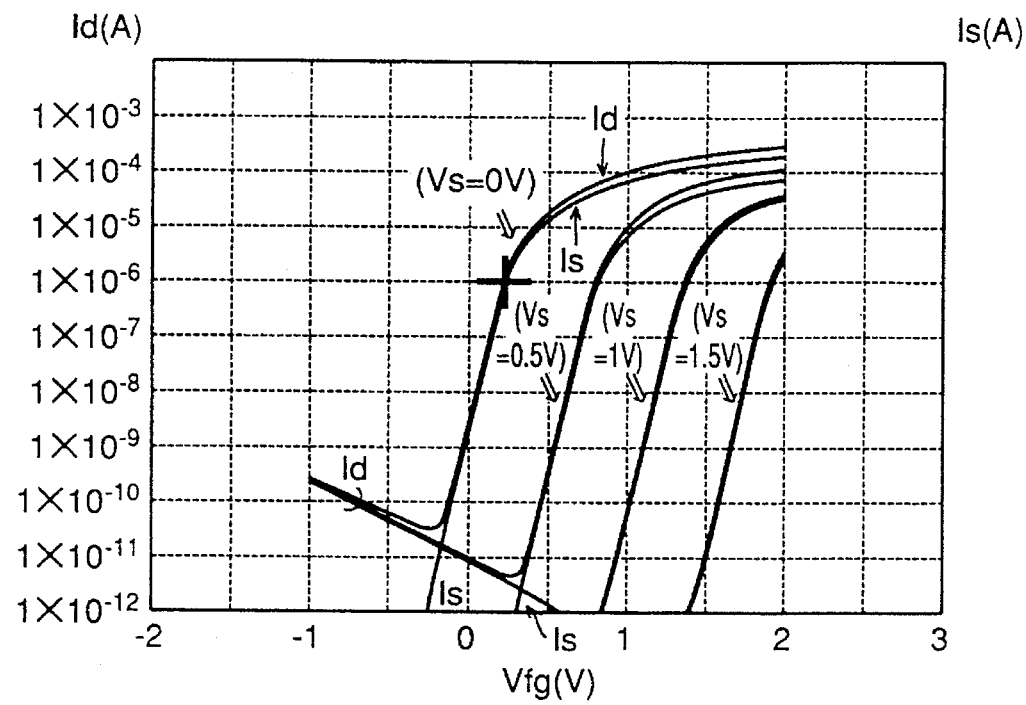
FIG. 10 shows the sub threshold characteristics where a positive bias is applied to the source region.

Referring to FIG. 10 showing sub threshold characteristics in the DINOR type flash memory, it is appreciated that channel leakage is suppressed to not more than 1 pA even when the floating gate potential Vfg is approximately 0.6 V by applying a source voltage (Vs) of approximately 1 V, for example, to the source region. This means that a channel is not formed in the memory transistor. It is therefore possible to effectively suppress change in the CP load by suppressing increase in the source potential. Thus, stable writing characteristics can be obtained.

Figure 9:
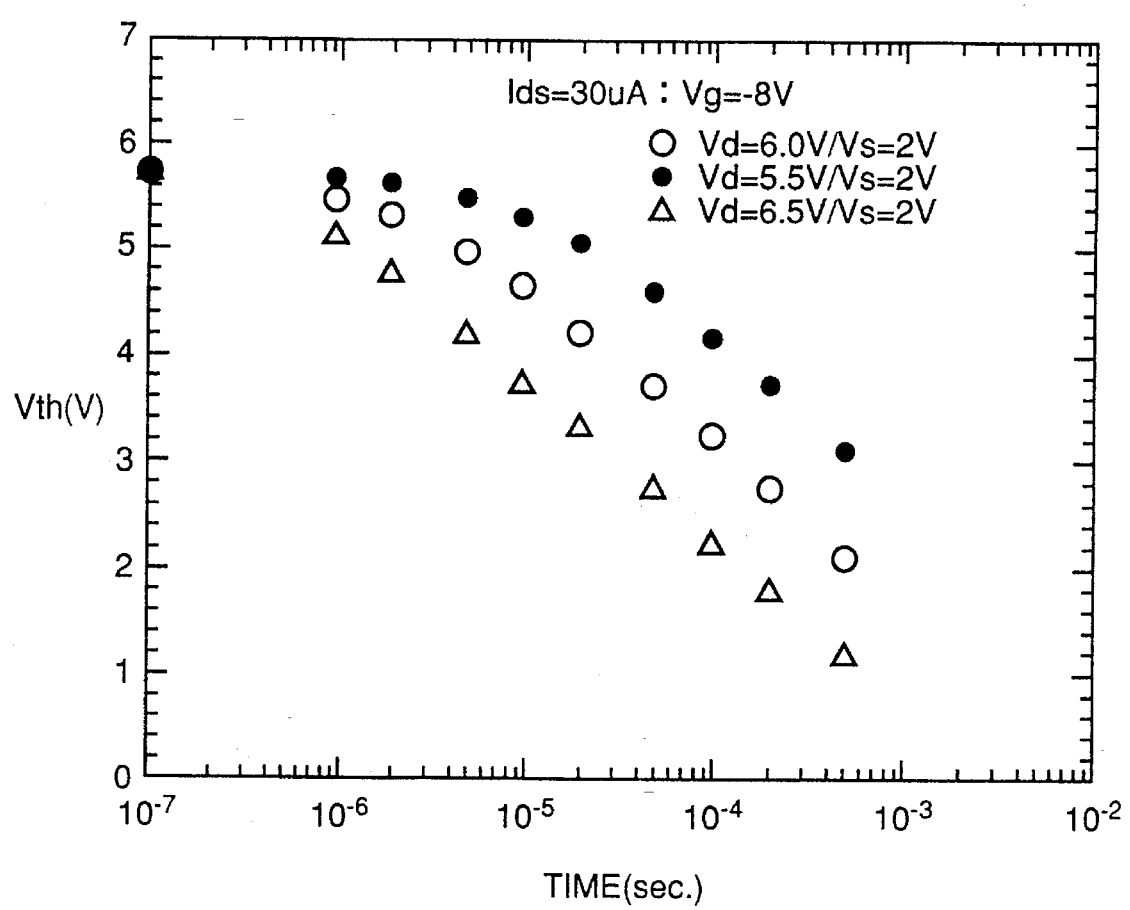
FIG. 9 shows the relationship between the time required for writing and the threshold voltage of a memory transistor over a drain voltage (Vd).
Figure 17:
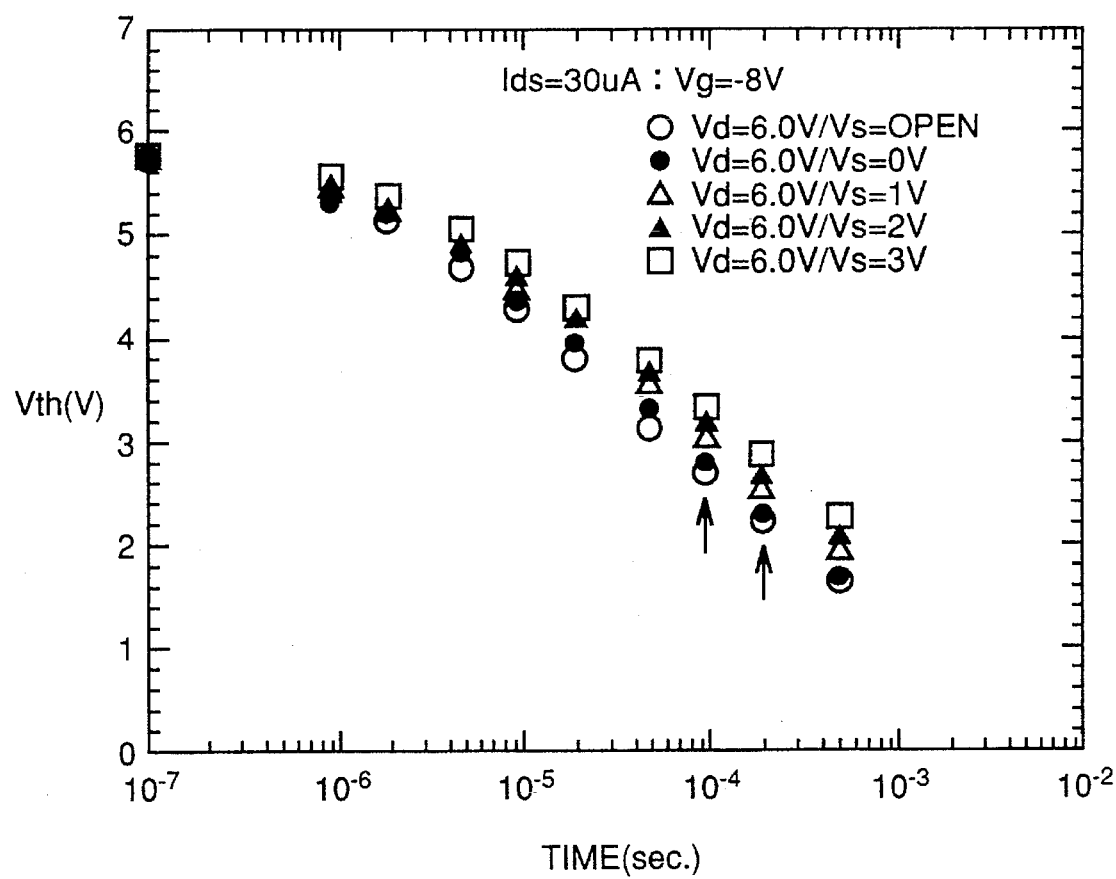
FIG. 17 shows the relationship between the threshold voltage Vth and a writing time period of a memory transistor over source potential in a conventional DINOR type flash memory.

It is to be noted that the writing speed is slightly reduced (refer to FIG. 17) by applying a positive voltage to source region 21 as described above. However, this reduction in the writing speed can be avoided by increasing the bit line (drain) potential. FIG. 9 shows the change in the writing time period when the bit line potential is varied.

Source positive voltage applying means 28 will be described in further detail. As shown in FIG. 3, source positive voltage applying means 28 includes a positive voltage generation circuit 18 and a source control circuit 13. A predetermined positive voltage to be applied to source region 21 is generated by positive voltage generation circuit 18. More specifically, positive voltage generation circuit 18 generates a positive voltage in which the electric field between the source region and floating gate 25 is not more than 4.3 MV/cm by applying a predetermined voltage to source region 21 via source control circuit 13. When the thickness of gate insulation layer 24 is approximately 80 Å, the coupling between source region 21/floating gate 25 is 0.1, the coupling between floating gate 25/control gate 27 is 0.6, and ΔVth=3 V at the beginning of a writing operation, the voltage applied to source region 21 is not more than approximately 1.8 V. This value was selected under the consideration that desired characteristics are to be obtained even after a writing/erasing cycle is repeated for approximately 10,000 times, and that the threshold voltage Vth of the memory transistor must be approximately Vth>4.6 at approximately ~500 msec in order to achieve byte writing in a DINOR type flash memory.

By applying a positive voltage of approximately 1.8 V to source region 21, floating gate potential Vfg is represented as Vfg=−0.6×3+0.1×1.8=−1.62 V. Thus, the electric field between source region 21/floating gate 25 is (1.8−(−1.62))/80 Å=4.28 MV/cm. A predetermined positive voltage must be applied to source region 21 so that the electric field between source region 21 and floating gate 25 is below such a value. Thus, a DINOR type flash memory having writing characteristics improved and having a high performance is obtained.

Figure 2:
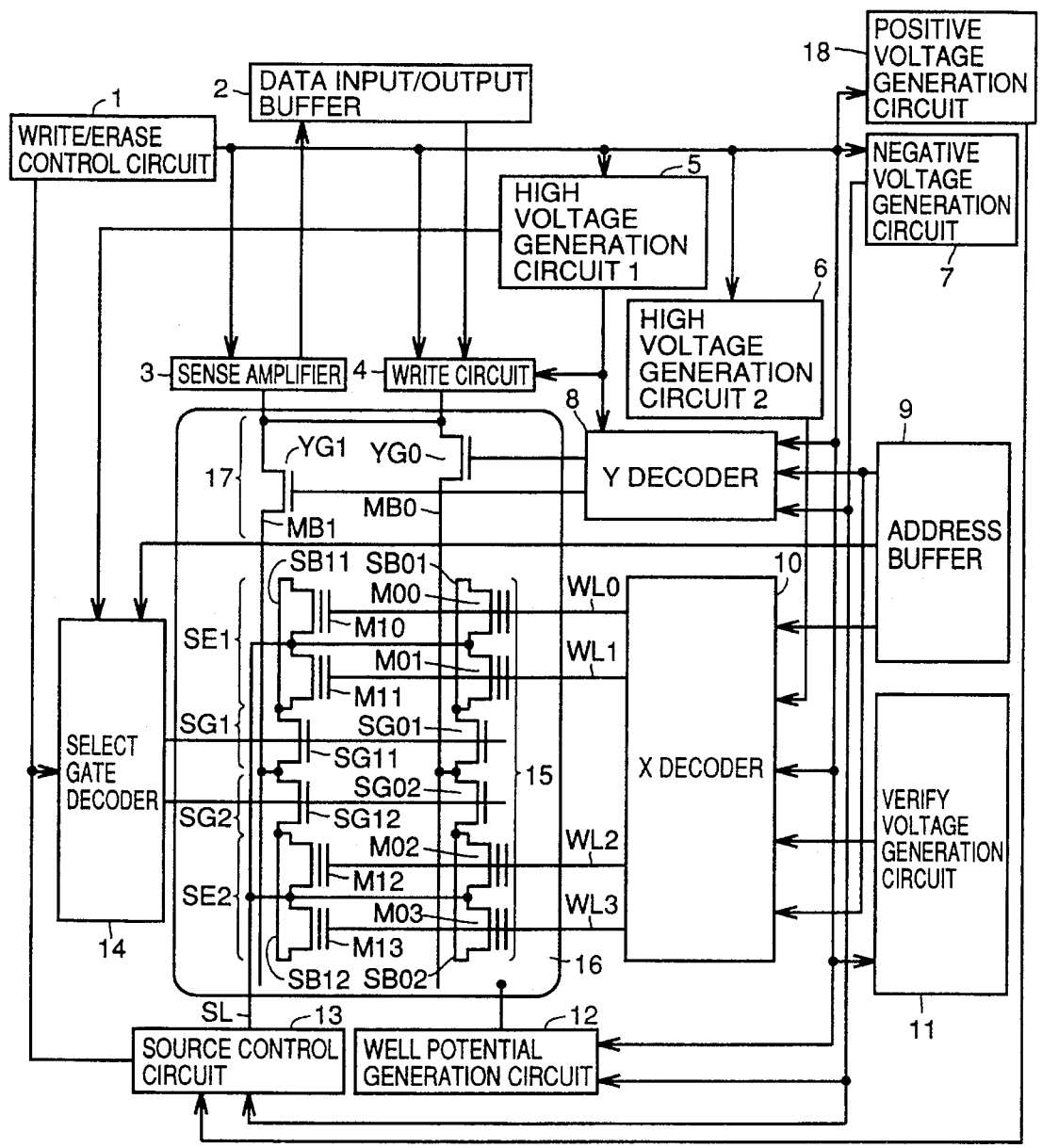
FIG. 2 is a block diagram showing a structure of a DINOR type flash memory according to a first embodiment of the present invention.
Figure 3:
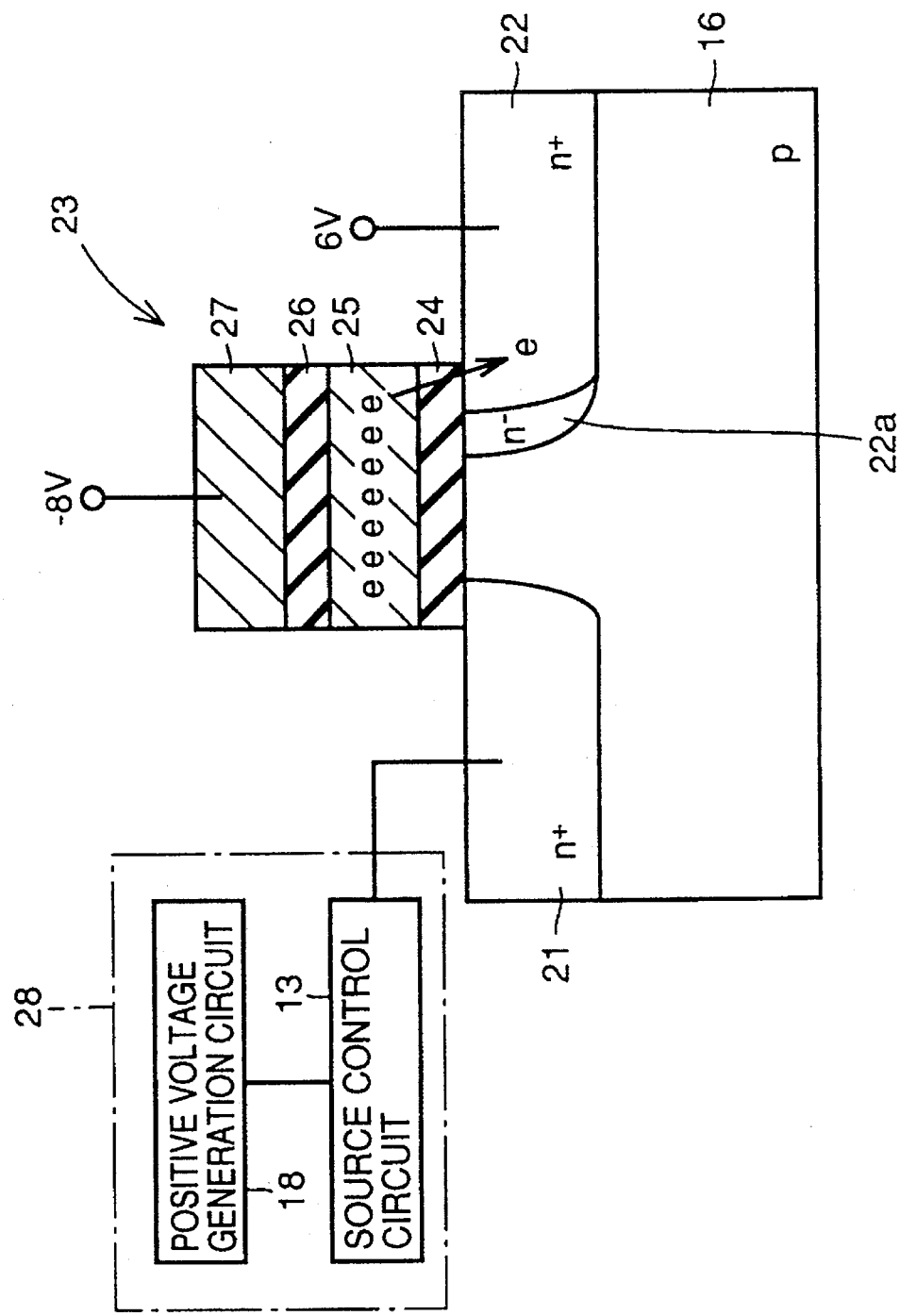
FIGS. 3 and 4 are schematic diagrams showing the concept of first and second embodiments, respectively, of the present invention.
Figure 12:
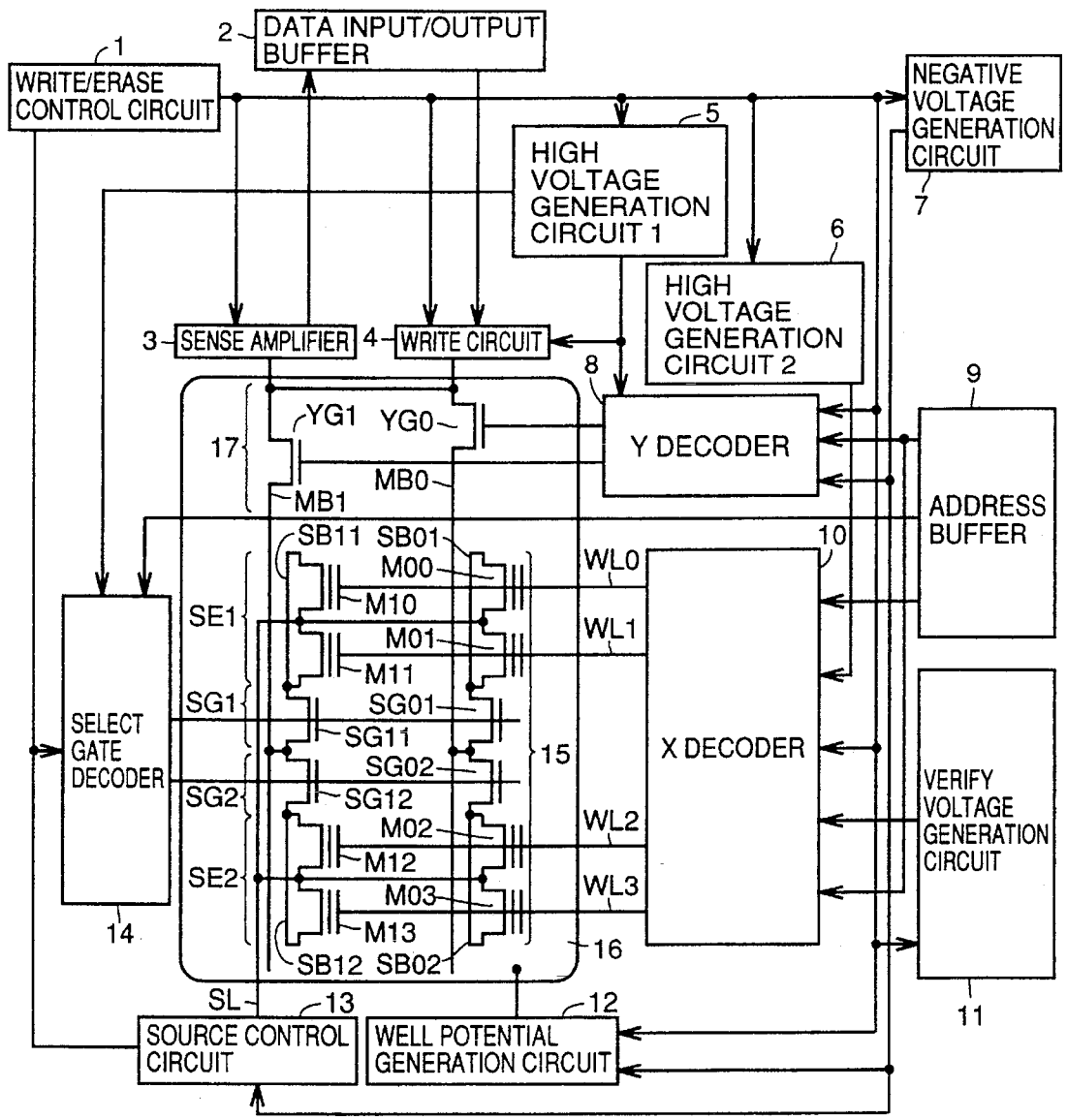
FIG. 12 is a block diagram showing a structure of a conventional DINOR type flash memory.
Figure 13:
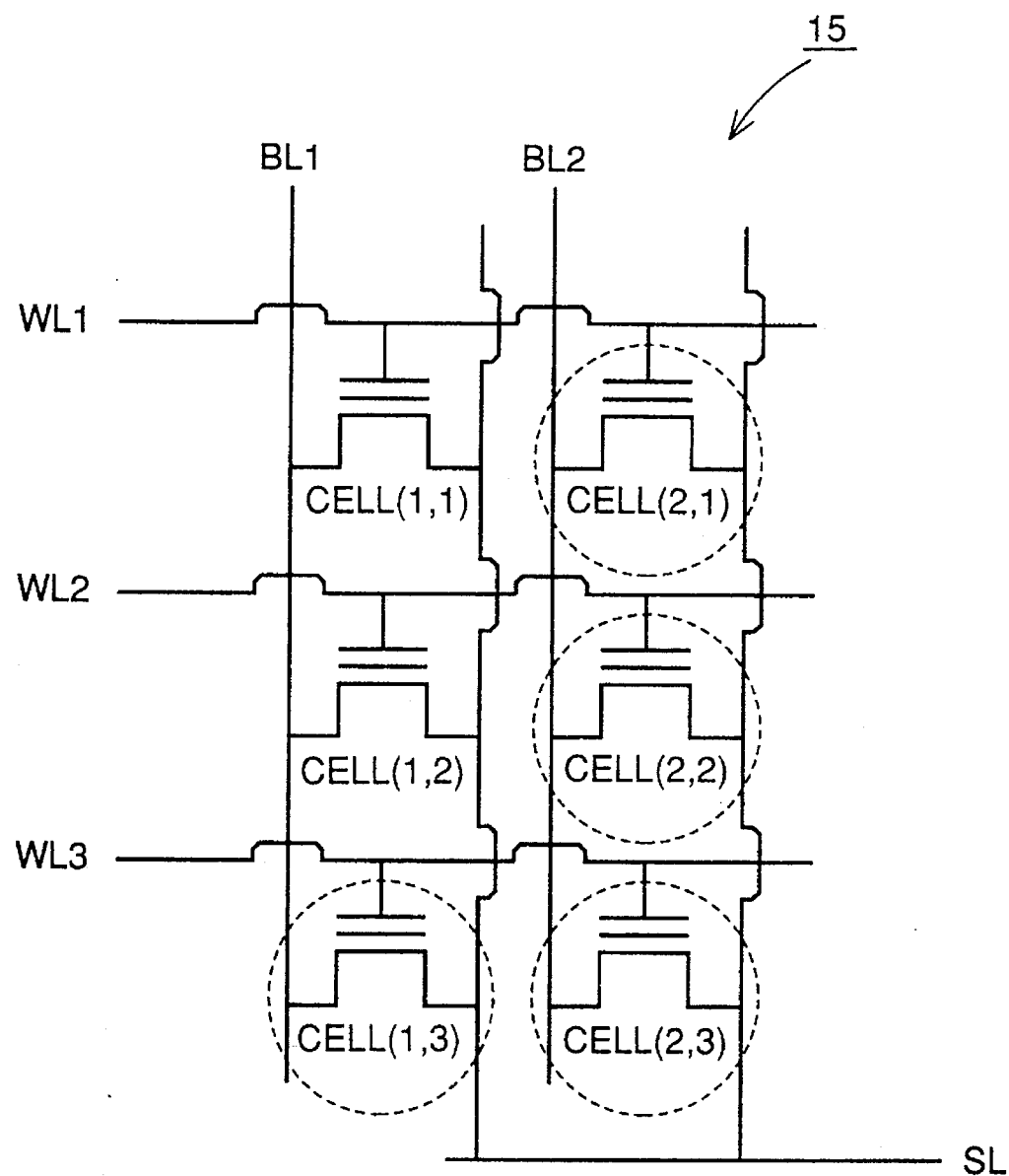
FIG. 13 is an equivalent circuit diagram of a memory cell array unit of a conventional DINOR type flash memory.
Figure 14:
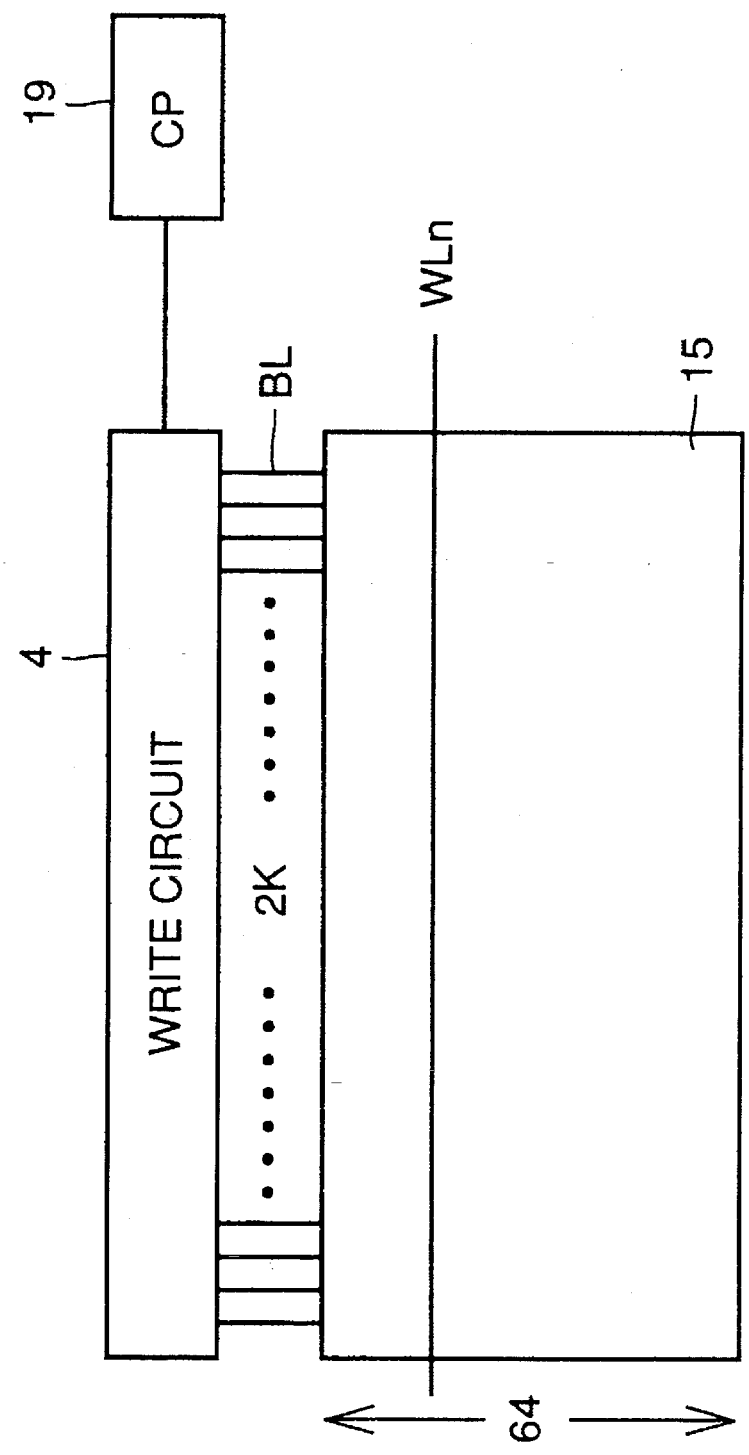
FIG. 14 is a block diagram for describing a writing operation of a conventional DINOR type flash memory.
Figure 15:
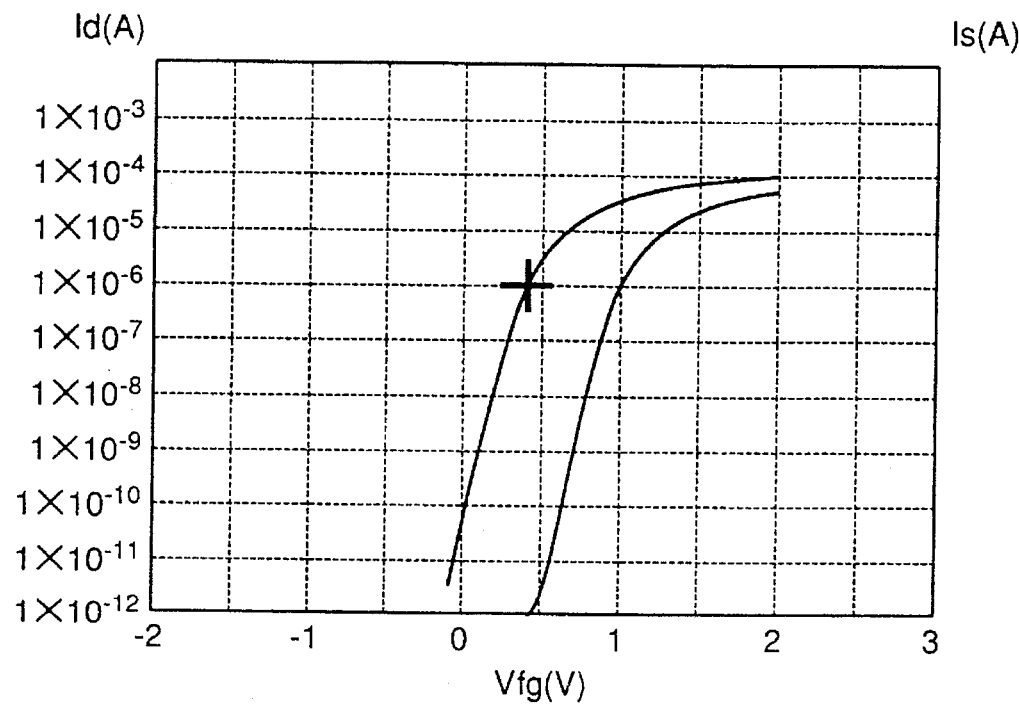
FIG. 15 shows the sub threshold characteristics of a memory transistor in a conventional DINOR type flash memory.
Figure 16:
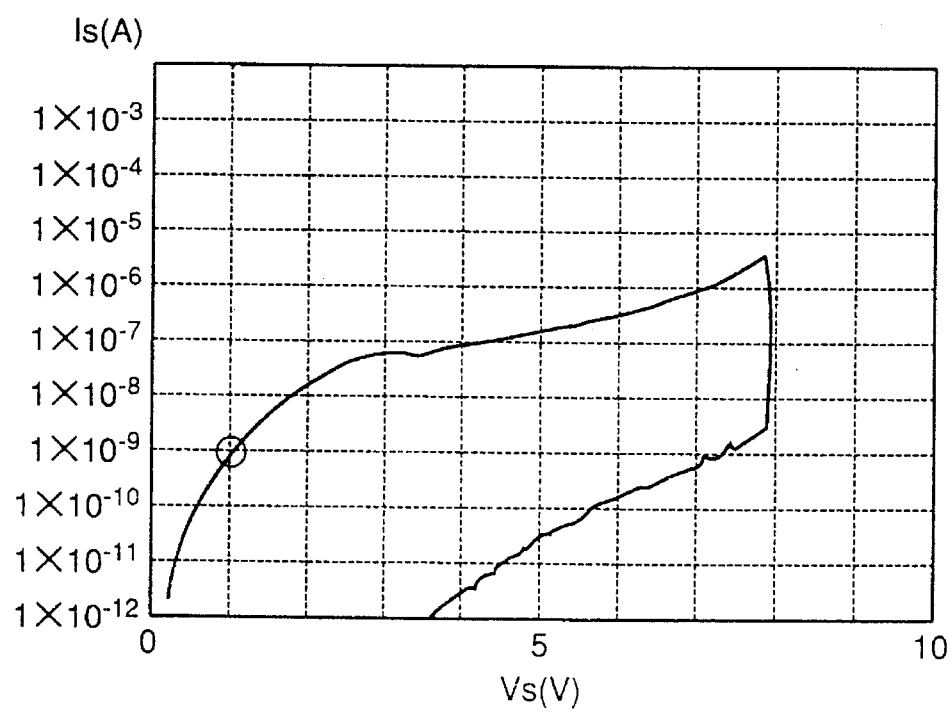
FIG. 16 shows a manner in which the source potential is reduced due to electrons of the tunnel effect current.

FIG. 2 shows a specific structure of a DINOR type flash memory according to the present embodiment. Referring to FIG. 2, a DINOR type flash memory of the present embodiment includes a positive voltage generation circuit 18. Positive voltage generation circuit 18 is connected to source control circuit 13. The remaining structure is similar to that of the DINOR type flash memory of FIG. 12.

The concept of the present embodiment is also applicable to a NOR type flash memory. In this case, the above-described positive bias is applied to the drain region. Thus, favorable erasing characteristics are obtained for a NOR type flash memory.

Second Embodiment

A second embodiment of the present invention will be described with reference to FIGS. 4–8. First, the concept of the present embodiment will be described.

Figure 4:
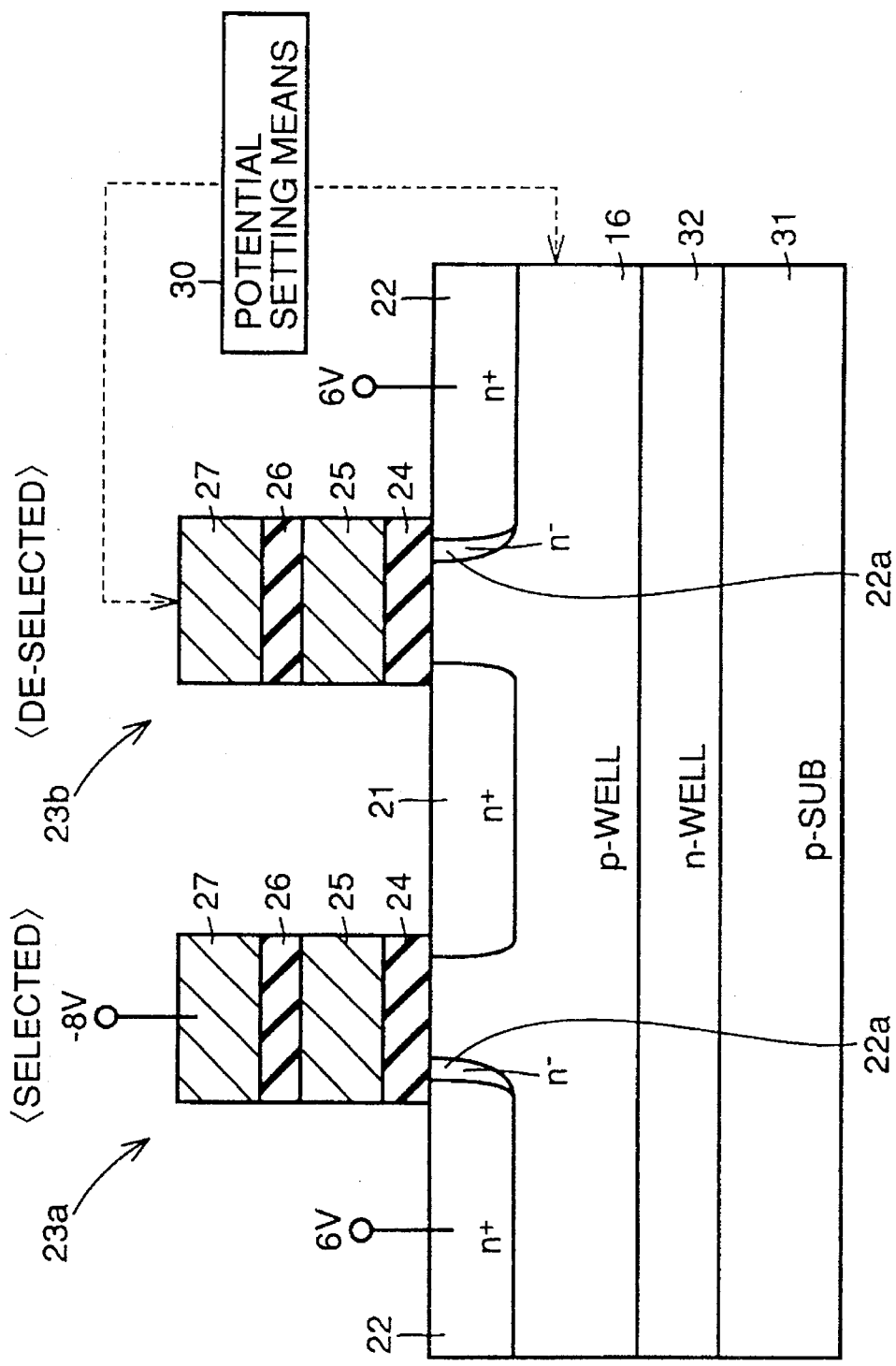

Referring to FIG. 4, an n well region 32 is formed in a main surface of a p type semiconductor substrate 31. A p well region 16 is formed in n well region 32. Two memory transistors 23a and 23b are formed at the surface of p well region 16. Here, it is assumed that memory transistors 23a and 23b are connected to the same bit line, wherein memory transistor 23a is selected to be written and memory transistor 23b is a de-selected transistor.

A voltage of −8 V is applied to control gate 27 of memory transistor 23a and a voltage of 6 V is applied to drain region 22 of memory transistor 23a. A voltage of 6 V is also applied to the drain region of memory transistor 23b which is a de-selected transistor. Here, potential setting means 30 is connected to p well region 16 or control gate 27 of de-selected memory transistor 23b.

Potential setting means 30 serves to set the potential of control gate 27 (word line) of the de-selected memory transistor 23b to a relatively negative potential with respect to p well region 16 in drawing out electrons from floating gate 25 of memory transistor 23a. It is therefore possible to prevent a channel from being formed in de-selected memory transistor 23b. As a result, the source potential in de-selected memory transistor 23b can be prevented from rising, and change in the load of the charge pump can be suppressed effectively. Thus, the writing characteristics of a DINOR type flash memory can be improved. The concept of the present application is also applicable to a NOR type flash memory.

Two examples realizing the concept of the present embodiment will be described hereinafter with reference to FIGS. 5–8.

(1) First Example

Figure 5:
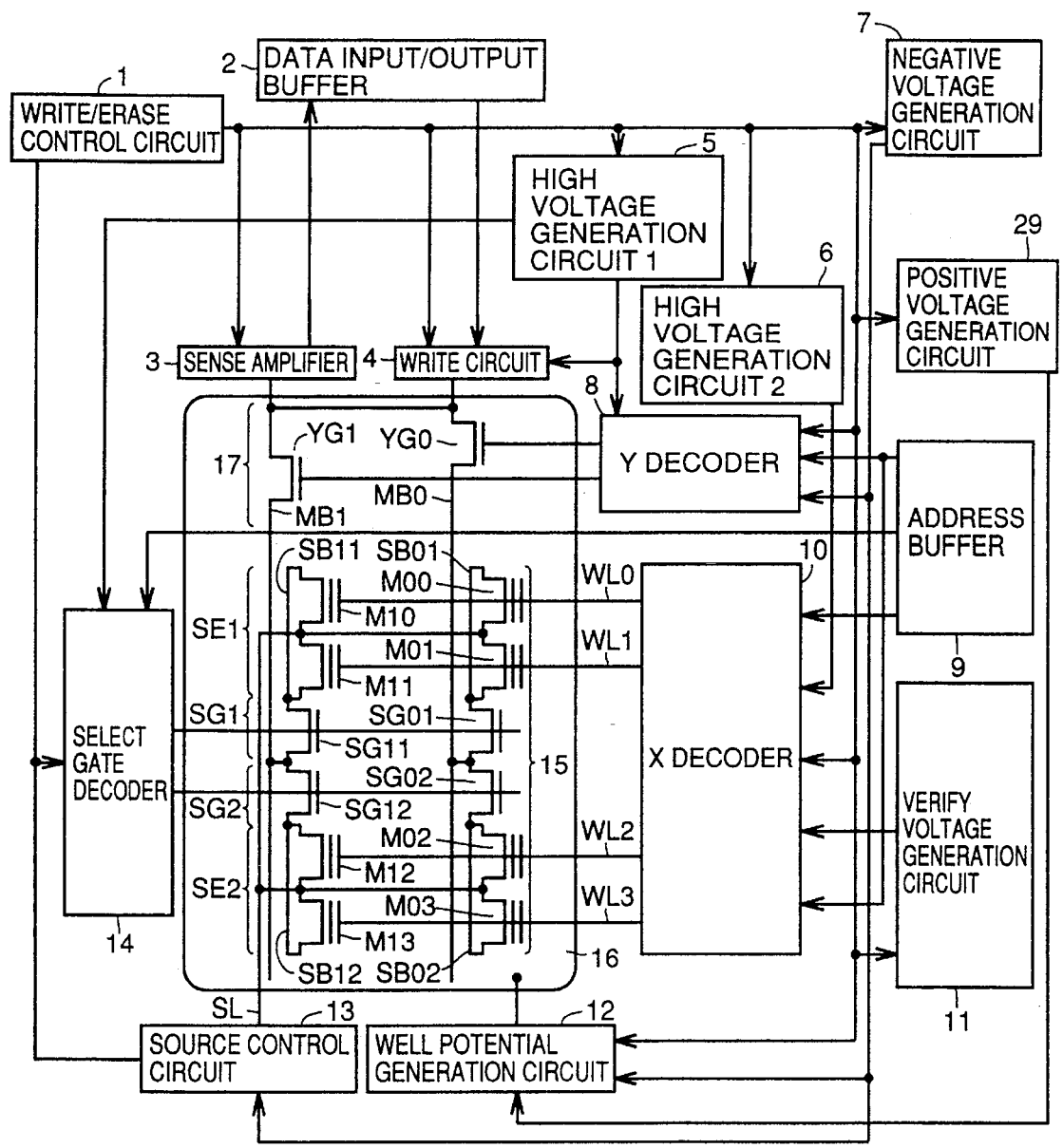
FIG. 5 is a block diagram showing a structure of a DINOR type flash memory according to a first example of the second embodiment.

The first example will be described with reference to FIGS. 5 and 6.

Figure 6:
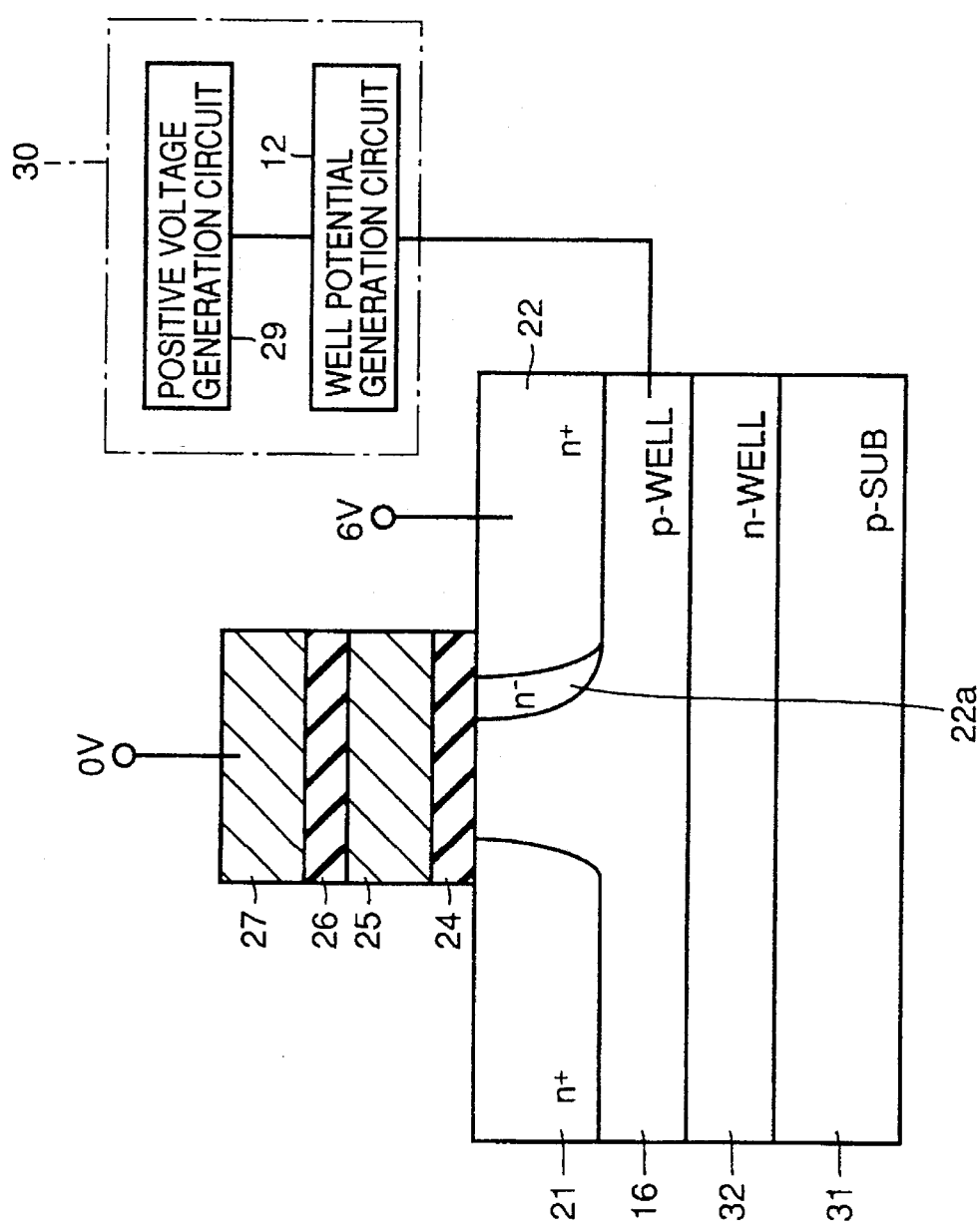
FIG. 6 schematically shows the concept of the first example of the second embodiment.

Referring to FIG. 6, the above-described potential setting means 30 is connected to p well region 16. Here, 0 V is applied to control gate 27 of a de-selected memory transistor. Potential setting means 30 includes a positive voltage generation circuit 29 and a well potential generation circuit 12 as shown in FIG. 6. A predetermined positive voltage generated by positive voltage generation circuit 29 is applied to p well region 16 via well potential generation circuit 12.

Figure 11:
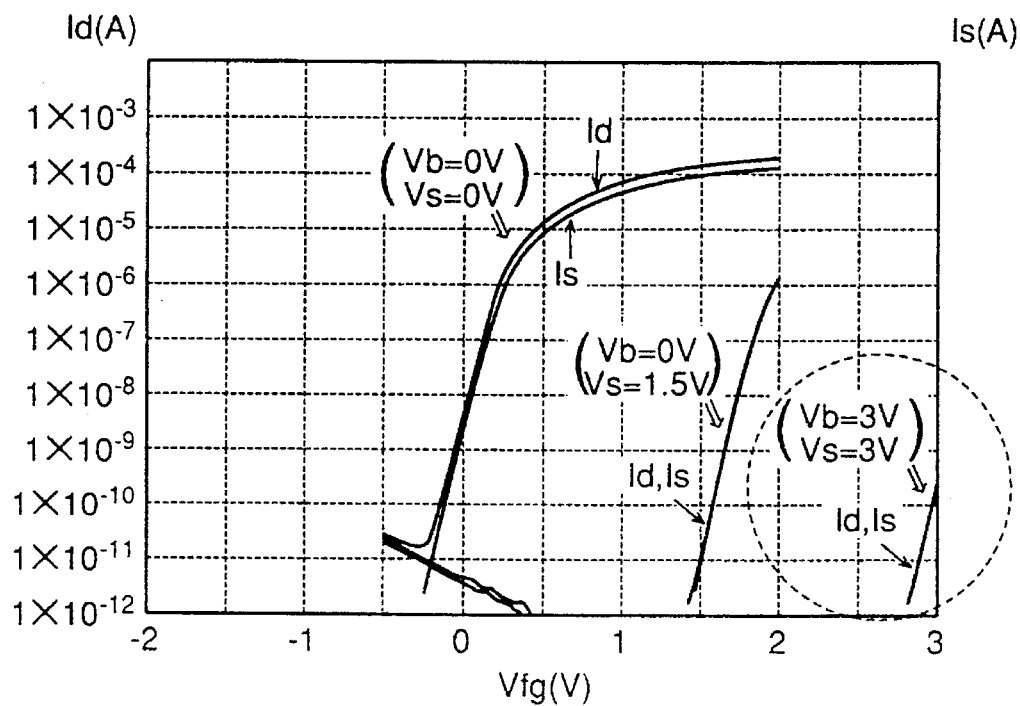
FIG. 11 shows the sub threshold characteristics where a positive bias is applied to the substrate (well region).

The positive voltage applied to p well region 16 is of a level in which leakage current is not generated between source/drain regions 21, 22 and p well region 16. By applying a predetermined positive voltage to p well region 16 by potential setting means 30, the potential of floating gate 25 can be reduced by the potential applied to p well region 16. Thus, formation of a channel in a de-selected memory transistor can be suppressed effectively. As in the case of the above-described first embodiment, it is possible to suppress effectively variation in the charge pump load. Thus, the writing characteristics can be improved. It can be appreciated from FIG. 11 showing the sub threshold characteristics that the application of a positive voltage (Vbb=3 V) to p well region 16 suppresses formation of a channel.

It is also possible to reduce the potential difference between p well region 16 and drain region 22 by applying a positive voltage to p well region 16. It is therefore possible to suppress leakage current between drain region 22 and p well region 16. This contributes to suppression of the charge pump load to a low level. It is therefore possible to increase the rising speed of a charge pump, which in turn allows improvement of the writing speed.

A specific structure of a DINOR type flash memory of a first example will be described with reference to FIG. 5. In the DINOR type flash memory of the first example, a positive voltage generation circuit 29 is provided which is connected to a well potential generation circuit 12. The remaining structure is similar to that of the DINOR type flash memory shown in FIG. 12.

(2) Second Example

A DINOR type flash memory according to a second example will be described with reference to FIGS. 7 and 8.

Figure 8:
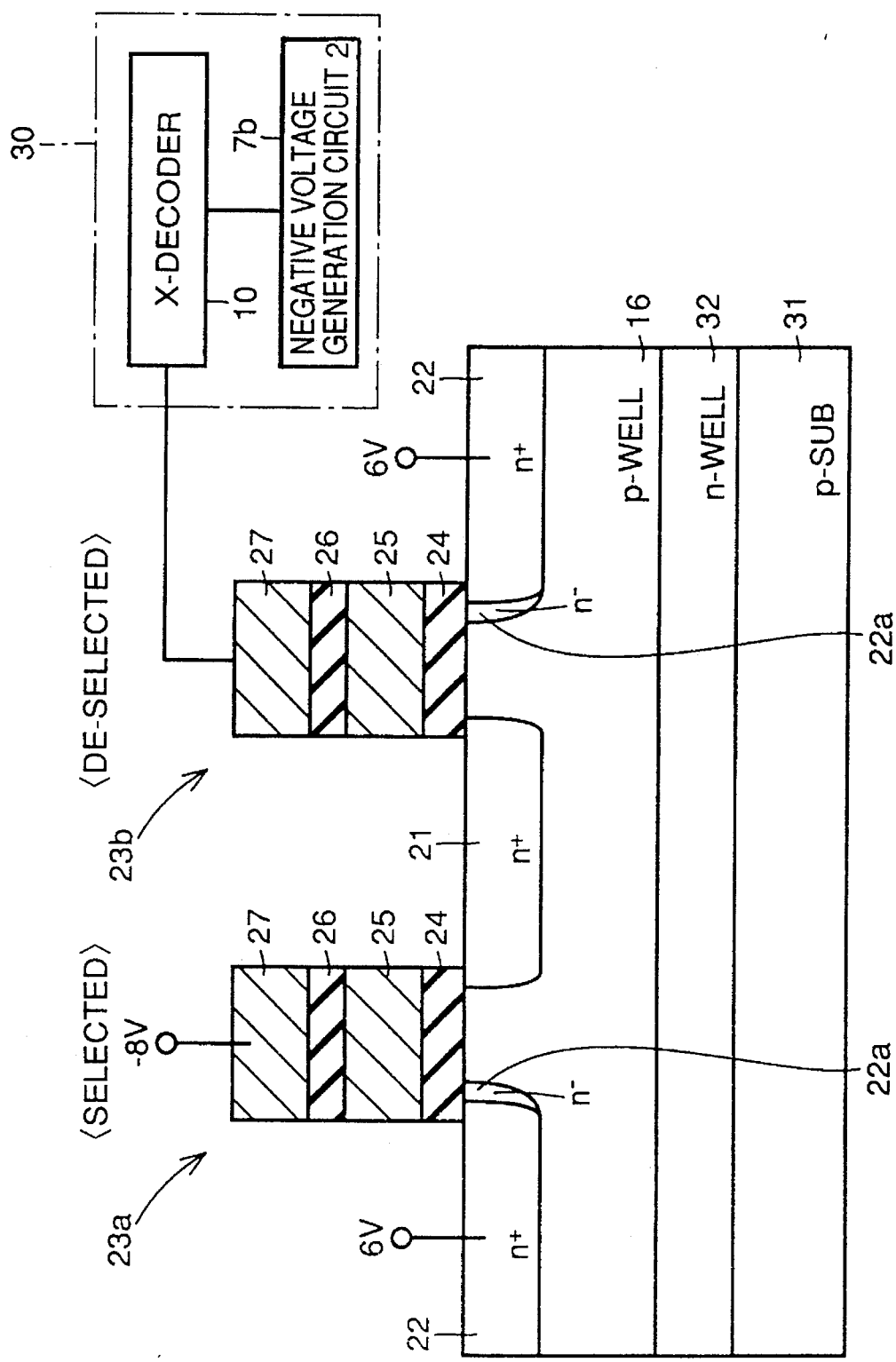
FIG. 8 schematically shows the concept of the second example of the second embodiment.

Referring to FIG. 8, a potential setting means 30 is connected to control gate 27 of de-selected memory transistor 23b. By this potential setting means 30, a negative bias of approximately −1 V, for example, is applied to control gate 27 of de-selected memory transistor 23b. Here, the negative bias applied to control gate 27 must be of a level that does not cause drawing of electrons from floating gate 25. By applying a negative bias to control gate 27 of de-selected memory transistor 23b by potential setting means 30, the potential of floating gate 25 can be set lower than the threshold voltage Vth of the memory transistor. It is therefore possible to effectively suppress formation of a channel in a de-selected memory transistor. Thus, the source potential in de-selected memory transistor 23b is prevented from rising, allowing stabilization of the charge pump load. Thus, stable writing characteristics are obtained.

As shown in FIG. 8, potential setting means 30 includes a X decoder 10 and a negative voltage generation circuit 7b. The above-described negative voltage of approximately −1 V is generated by negative voltage generation circuit 7b. The negative potential is applied to control gate 27 of de-selected memory transistor 23b via X decoder 10. Here, the value of the negative voltage applied to control gate 27 of de-selected memory transistor 23b by potential setting means 30 is preferably a level that can set the value of potential Vfg of floating gate 25 of de-selected memory transistor 23b to approximately 0 V. It is therefore possible to effectively suppress formation of a channel in de-selected memory transistor 23b.

Figure 7:
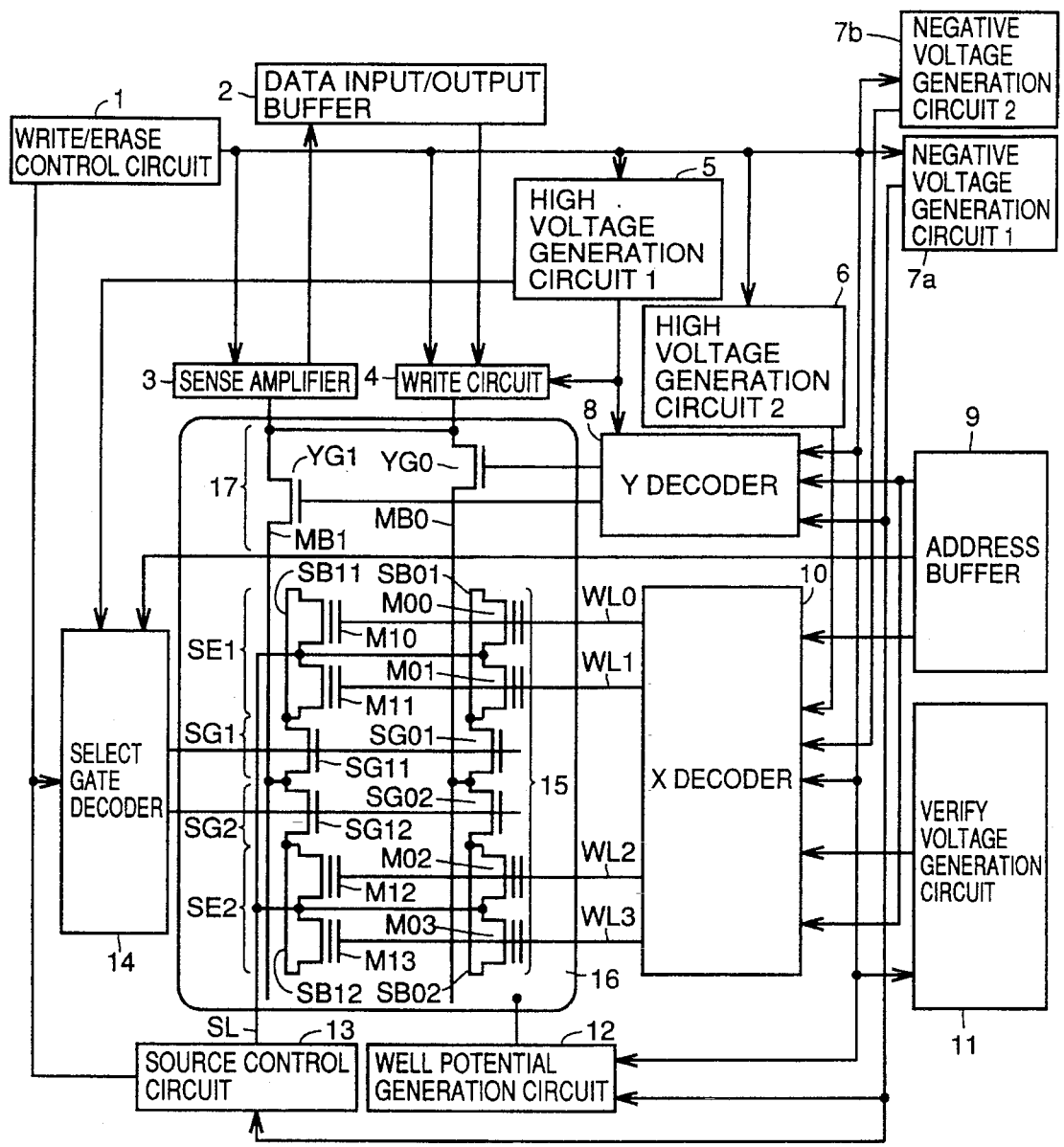
FIG. 7 is a block diagram showing a structure of a DINOR type flash memory according to a second example of the second embodiment.

Referring to FIG. 7, a negative voltage generation circuit 7b is provided to which X decoder 10 is connected. The remaining structure is similar to that of the DINOR type flash memory of FIG. 12.

According to a nonvolatile semiconductor memory device of the present invention, it is possible to stabilize a charge pump load. As a result, reduction in the rising speed of the charge pump can be prevented effectively. Thus, stable writing characteristics and stable erasing characteristics can be provided in a DINOR type nonvolatile semiconductor memory device and a NOR type nonvolatile semiconductor memory device, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a semiconductor substrate including a main surface, a well region formed in the main surface of the semiconductor substrate, a memory transistor formed on said well region for storing data, a charge pump connected to a drain region of said memory transistor for generating a predetermined voltage applied to said memory transistor during data writing/erasing, and charge pump load control means connected to a source region of said memory transistor for suppressing charge pump load variation.

2. A nonvolatile semiconductor memory device comprising:

a semiconductor substrate including a main surface, a well region formed in the main surface of the semiconductor substrate, a memory transistor formed on said well region for storing data, a charge pump connected to said memory transistor for generating a predetermined voltage applied to said memory transistor during data writing/erasing, and charge pump load control means connected to said memory transistor or well region for suppressing charge pump load variation, wherein said memory transistor includes a pair of impurity diffusion layers formed spaced apart to define a channel region within said well region, a charge storage electrode formed on said channel region with a first insulation layer therebetween, and a control gate formed on said charge storage electrode with a second insulation layer therebetween, said charge pump load control means applies a positive voltage to one of said impurity diffusion layers such that electrons are drawn from said charge storage electrode by applying a voltage not greater than 4.3 MV/cm between the other of said impurity diffusion layers and said control gate.

3. The nonvolatile semiconductor memory device according to claim 2, wherein said one impurity diffusion layer includes a source region, said positive voltage applying means includes a positive voltage generation circuit for generating said positive voltage, and a source control circuit connected to said positive voltage generation circuit and said source region for applying a positive voltage to said source region.

4. The nonvolatile semiconductor memory device according to claim 2, wherein said first insulation layer has a thickness of approximately 80 Å, and wherein said positive voltage applying means applies a positive voltage of not more than approximately 1.8 V to said one impurity diffusion layer.

5. A nonvolatile semiconductor memory device comprising:

a semiconductor substrate including a main surface, a well region formed in the main surface of the semiconductor substrate, a memory transistor formed on said well region for storing data, a charge pump connected to said memory transistor for generating a predetermined voltage applied to said memory transistor during data writing/erasing, and charge pump load control means connected to said memory transistor or well region for suppressing charge pump load variation, wherein a first and a second of said memory transistors are formed on said well region, said first memory transistor including a first charge storage electrode, a first control gate, and a first source/drain region, said second memory transistor sharing said first source region with said first memory transistor, and including a second charge storage electrode, a second control gate, and a second drain region, wherein a bit line is formed on the main surface of said semiconductor substrate so as to be electrically connected to said first and second drain regions, wherein said charge pump load control means comprises potential setting means for setting said second control gate to a relatively negative potential with respect to said well region in drawing electrons from said first charge storage electrode by applying a predetermined voltage to said first control gate and said bit line.

6. The nonvolatile semiconductor memory device according to claim 5, wherein an impurity of a first conductivity type is introduced into said semiconductor substrate, a second well region of a second conductivity type is formed at the main surface of said semiconductor substrate, said well region is formed within said second well region, said potential setting means is connected to said well region to apply a predetermined positive voltage thereto, and 0 V is applied to said second control gate.

7. The nonvolatile semiconductor memory device according to claim 6, wherein said potential setting means comprises a positive voltage generation circuit for generating said positive voltage, and a well potential generation circuit connected to said positive voltage generation circuit and said well region for applying to said well region said positive voltage generated by said positive voltage generation circuit.

8. The nonvolatile semiconductor memory device according to claim 5, wherein said potential setting means is connected to said second control gate to apply a predetermined negative voltage thereto.

9. The nonvolatile semiconductor memory device according to claim 8, wherein said potential setting means comprises a negative voltage generation circuit for generating said negative voltage, and an X decoder connected to said negative voltage generation circuit and said second control gate for applying said negative voltage generated by said negative voltage generation circuit to said second control gate.

10. The nonvolatile semiconductor memory device according to claim 9, wherein the value of said negative voltage is determined so that the potential of said second charge storage electrode is approximately 0 V by having a negative voltage applied to said second control gate.

11. The nonvolatile semiconductor memory device according to claim 1, wherein said memory transistor comprises a charge storage electrode formed on said well region with an insulation layer therebetween, and a control gate formed on said charge storage electrode with an insulation layer therebetween, said memory transistor attaining an erase state by having electrons introduced into said charge storage electrode, and attaining a program state by having electrons drawn out from said charge storage electrode.

12. A nonvolatile semiconductor memory device comprising:

a semiconductor substrate including a main surface, a well region of a first conductivity type formed in the main surface of the semiconductor substrate, a source/drain region of a second conductivity type formed spaced apart so as to define a channel region of a memory transistor within said well region, a charge storage electrode of said memory transistor formed on said channel region with a first insulation layer therebetween, a control gate formed on said charge storage electrode with a second insulation layer therebetween, a charge pump connected to said memory transistor for generating a predetermined voltage applied to said memory transistor in data writing/erasing, and positive voltage applying means connected to said source region for suppressing charge pump load variation by applying a positive voltage to said source region such that the electric field across said source region and said charge storage electrode is not more than 4.3 MV/cm when applying a voltage between said drain region and said control gate to draw electrons from said charge storage electrode.

13. A nonvolatile semiconductor memory device comprising:

a semiconductor substrate of a first conductivity type having a main surface, a first well region of a second conductivity type formed in the main surface of said semiconductor substrate, a second well region of a first conductivity type formed within said first well region, a source region of a second conductivity type formed within said second well region, first and second drain regions of second conductivity type formed within said second well region and spaced apart from said source region to define first and second channel regions of first and second memory transistors at both sides of said source region, first and second charge storage electrodes of said first and second memory transistors formed on said first and second channel regions with an insulation layer therebetween, first and second control gates of said first and second memory transistors formed on said first and second charge storage electrodes with an insulation layer therebetween, a charge pump connected to said first and second memory transistors for generating a predetermined voltage applied to said first and second memory transistors in data writing/erasing, a bit line formed on the main surface of said semiconductor substrate so as to be electrically connected to said first and second drain regions, and potential setting means for suppressing variation in a load of said charge pump by setting said second control gate to a relatively negative potential with respect to said second well region in drawing out electrons from said first charge storage electrode of said first memory transistor by having a predetermined potential applied to said first control gate and said bit line.

14. A nonvolatile semiconductor memory device comprising:

a semiconductor substrate including a main surface, a well region formed in the main surface of the semiconductor substrate, a memory transistor formed on said well region for storing data, a charge pump connected to said memory transistor for generating a predetermined voltage applied to said memory transistor during data writing/erasing, and charge pump load control means connected to said memory transistor or well region for suppressing charge pump load variation, wherein the charge pump load variation is suppressed by suppressing a channel current in a nonselected memory transistor.

* * * * *